United States Patent [19]

O'Connor

[11] 3,787,771

[45] Jan. 22, 1974

[54] SINGLE-CHANNEL NOISE SUPPRESSOR

[76] Inventor: Edward O'Connor, 10212 Plymouth Ave., Cleveland, Ohio 44125

[22] Filed: Nov. 24, 1969

[21] Appl. No.: 879,332

[52] U.S. Cl. .................... 325/65, 179/1 P, 325/473

[51] Int. Cl. .......................................... H04b 15/00

[58] Field of Search ............325/65, 473, 478, 480, 325/481; 179/1 P; 178/DIG. 12

[56] References Cited

UNITED STATES PATENTS

| | | | |
|---|---|---|---|
| 2,194,292 | 3/1940 | Bligh et al. | 325/479 |
| 3,333,055 | 7/1967 | Krause | 178/6 |
| 1,550,660 | 8/1925 | Arrel | 325/65 |

OTHER PUBLICATIONS

MPEP -pages 44.1 - 46, 57

*Primary Examiner*—Robert L. Richardson
*Attorney, Agent, or Firm*—Albert R. Teare et al.

[57] ABSTRACT

A signal containing low-level noise, whose frequency components are contained in a band of frequencies which may be considerably greater than one octave, as for example, audio from a phonograph record, is converted to a higher band of frequencies whose range is less than or equal to one octave, as for example, by a modulator and a high-pass filter. The converted band of frequencies is transmitted to a threshold device designed to reject any signal below a predetermined threshold value. The output of the threshold device is, accordingly, free of signals corresponding to the original low-level noise contained in the low-frequency band signal. The output of the threshold device is then reconverted to the original band of frequencies, as for example, by a modulator and low-pass filter, to produce an output identical to the original signal except for the absence of the low-level noise. This output signal is free of the harmonic distortion which would result if the original signal was merely applied directly to the threshold device.

6 Claims, 2 Drawing Figures

INVENTOR

Edward O'Connor

INVENTOR

Edward O'Connor

SINGLE-CHANNEL NOISE SUPPRESSOR

In general, noise suppression devices operate to give attenuation of a band or bands of audio frequencies, where the attenuation may be fixed or may vary according to the input level to minimize the effects of frequency discrimination. A method which has been used previously which avoids frequency discrimination operates by means of a threshold circuit which passes only that part of an input waveform which exceeds a predetermined level. In this way, low-level noise will be rejected in the absence of an input, and will be masked by the signal when the signal level exceeds the predetermined level. It is necessary to remove the harmonics generated by the threshold circuit by means of filters if distortion is to be avoided. Since the audio range covers several octaves, multichannel operation is required if the input frequencies are operated on directly. One version of this type of noise suppressor consists of a number of parallel channels, the first consisting of a low pass filter while the remaining channels cover succesive octaves above the cutoff frequency of the low pass filter, each remaining channel consisting of two band pass filters separated by a threshold circuit. The purpose of the first filter in each channel is to eliminate frequencies whose harmonics would fall in the one-octave band covered by the channel. The purpose of the second filter is to suppress harmonics of frequencies in this octave generated by the threshold circuit. This filter also serves to eliminate part of the intermodulation products generated by the threshold circuit in the presence of more than one input frequency. If inductor-capacitor filters are used, the large number of a.f. inductors required make the device large, heavy and expensive. In addition, it is impractical to make the filters sharp enough to completely reject the octave harmonics.

The present invention is intended to accomplish the results of the device referred to above without the disadvantages of low-frequency multichannel operation. It is therefore an object of the present invention to accomplish the suppression of low-level background noise without frequency discrimination by the use of a single channel. It is another object of this invention to avoid the use of low-frequency filters. It is also an object of this invention to eliminate non-linear distortion for a single input frequency. It is another object of this invention that audible distortion of program material should not occur if the threshold level is not extreme. Further objects of this invention are that the device should be relatively small, light and inexpensive.

In accordance with these objects, the present invention is a threshold noise suppressor operating on the principle of frequency conversion. In one embodiment, a modulator is used to transfer the audio to the 20 k.c.–40 k.c. range by means of a 20 k.c. sideband-discrimination filter. The 20 k.c.–40k.c. sideband is operated upon by a threshold circuit to reject sideband levels corresponding to audio background noise. A single 40 k.c. filter serves to eliminate the sideband harmonics. The harmonic rejection can be made much greater than is possible in the method described above since a large number of sharp-cutoff, narrow-range a.f. filters is not required. After noise rejection, the audio is recovered by a modulator and 40 k.c. low pass filter.

For a sine-wave input, operation is as follows. A carrier frequency of 20 k.c. is simultaneously applied to the first and second modulators. An input frequency f produces sideband frequencies 20 k.c.–f and 20 k.c.+f in the first modulator, of which the upper sideband frequency 20 k.c.+f is passed by the 20 k.c. high pass sideband-discrimination filter. The upper sideband frequency 20 k.c.+f produces sideband frequencies (20 k.c.+f)–20 k.c. and (20 k.c.+f)+20 k.c. in the second modulator, of which the lower sideband frequency (20 k.c.+f)–20 k.c., or f, is passed by the 40 k.c. low pass filter. Harmonics of the upper sideband frequency 20 k.c.+f are generated in the threshold circuit. These harmonics are 40 k.c.+2f, 60 k.c.+3f,..., and so on. Since these frequencies are above 40 k.c. for any input frequency f in the audio range, they are rejected by the 40 k.c. low pass filter following the threshold circuit. This filter is unnecessary if the second modulator is entirely free of carrier second harmonics. This is so because the difference frequencies produced by these harmonics in the second modulator are above 20 k.c., so that they are inaudible, and will not be present at the output if 20 k.c. is used for the output filter cutoff frequency. However, audible difference frequencies would be produced by the harmonics if significant levels of carrier harmonics were generated by the second modulator. It is because of the effects of residual carrier harmonics on low-level outputs from the threshold circuit that the 40 k.c. filter referred to above is used.

It is necessary that the lower sideband output of the first modulator be suppressed considerably with respect to the upper sideband output, for otherwise intermodulation between the upper and lower sidebands 20 k.c.+f and 20 k.c.–f will occur in the threshold circuit, resulting in the production of harmonincs of the input frequency f at the output of the second modulator. This is so because the frequency pairs 20 k.c.–f, 40 k.c.+2f; 40 k.c.–2f, 60 k.c.+3f;. . . , etc., present in the threshold circuit will produce difference products 20 k.c.+3f, 20 k.c.+5f, . . . , etc., which in turn will produce the frequencies 3f, 5f,. . . , etc., at the output of the device. It is also clear that this fault of double-sideband operation would exist for any carrier frequency.

It can be seen that since the upper and lower sidebands 20 k.c.+f and 20 k.c.–f produced by the first modulator are nearly equal for low values of f, the transition band of the 20 k.c. high pass filter is required to be extremely sharp if the low frequency response of the noise suppressor is to cover the entire audio range. The transition band of the filter used in the device described herein is 200 c.p.s. in width with a minimum rejection of 30 db. for the lower sideband frequencies. The overall response of the noise suppressor is flattened to 20 c.p.s. by means of conventional low-frequency equalization beginning at 500 c.p.s. and increasing to 6 db. at 100 c.p.s.

Higher values of operating frequency for the high pass filter are not advisable due to the increasing difficulty of obtaining an extremely narrow transition band.

A basic problem in the use of a 20 k.c. operating frequency for the high pass filter is that carrier harmonics generated internally by the first and second modulators will cause a degradation of quality. Therefore a requirement of the invention described in this application is the use of modulators that do not generate significant levels of carrier harmonics.

The effects of carrier harmonics in the first and second modulators may be seen from the following. If the carrier frequency applied to the second modulator is 20 k.c., the carrier harmonics will be 40 k.c., 60 k.c. , . . ., etc. A 40 k.c. second harmonic present in the second modulator will be modulated by the 20 k.c.+f upper sideband input frequency and cause a difference frequency 40 k.c.−(20 k.c.+f), or 20 k.c.−f to appear at the output of the modulator. This difference frequency is below 20 k.c. and will be passed by the output low pass filter. This results in the production of two output frequencies for a single input frequency. If the carrier frequency applied to the first modulator is 20 k.c., the carrier harmonics will again be 40 k.c., 60 k.c., . . . , etc. A 40 k.c. second harmonic present in the first modulator will be modulated by the input frequency f to produce a difference frequency 40 k.c.−f in the modulator output. Since this difference frequency is in the 20 k.c.–40 k.c. range, it will modulate the carrier fundamental in the second modulator to produce a lower sideband frequency (40 k.c.−f)–20 k.c., or 20 k.c.−f, which is the same as the previous case. Therefore the presence of carrier harmonics in either modulator results in the production of a second output frequency for each input frequency, which is unacceptable for high fidelity.

It is necessary that the components used in the 20 k.c. high pass filter be of high linearity and that the filter should be driven at a low level by circuitry of high linearity, in order to avoid the production of spurious output frequencies for input frequencies in the neighborhood of 10 k.c. This is so because an input frequency of 10 k.c.+f will produce upper and lower sideband frequencies of 30 k.c.+f and 10 k.c.−f, at the output of the first modulator which in the presence of nonlinearity will modulate each other to produce a difference frequency of 20 k.c.+2f, which will in turn produce an output frequency of 2f. These spurious frequencies are in the low and middle audio range for input frequencies close to 10 k.c. and will degrade the input frequencies unless their levels are very low. This effect is not extremely noticeable for program material, since these frequencies will be masked by other low frequencies present, but will cause a certain "muddy" quality if pronounced.

It is desirable that the first modulator be of the balanced type, in order that the threshold circuit will not receive a carrier waveform and thereby lose the capacity to reject low sideband levels. A carrier imbalance in the first modulator corresponds to a hypothetical d.c. level at the input of the noise suppressor and resultant transposition of low-level input noise to a voltage level above the rejection level of the threshold circuit. Alternately, the first modulator may be unbalanced and a notch filter may be used to reject the carrier. It is desirable that the second modulator also be of the balanced type to avoid possible overdriving and resulting modulation effects in devices following the noise suppressor.

This invention is illustrated in the drawings in which.

Figure 1:
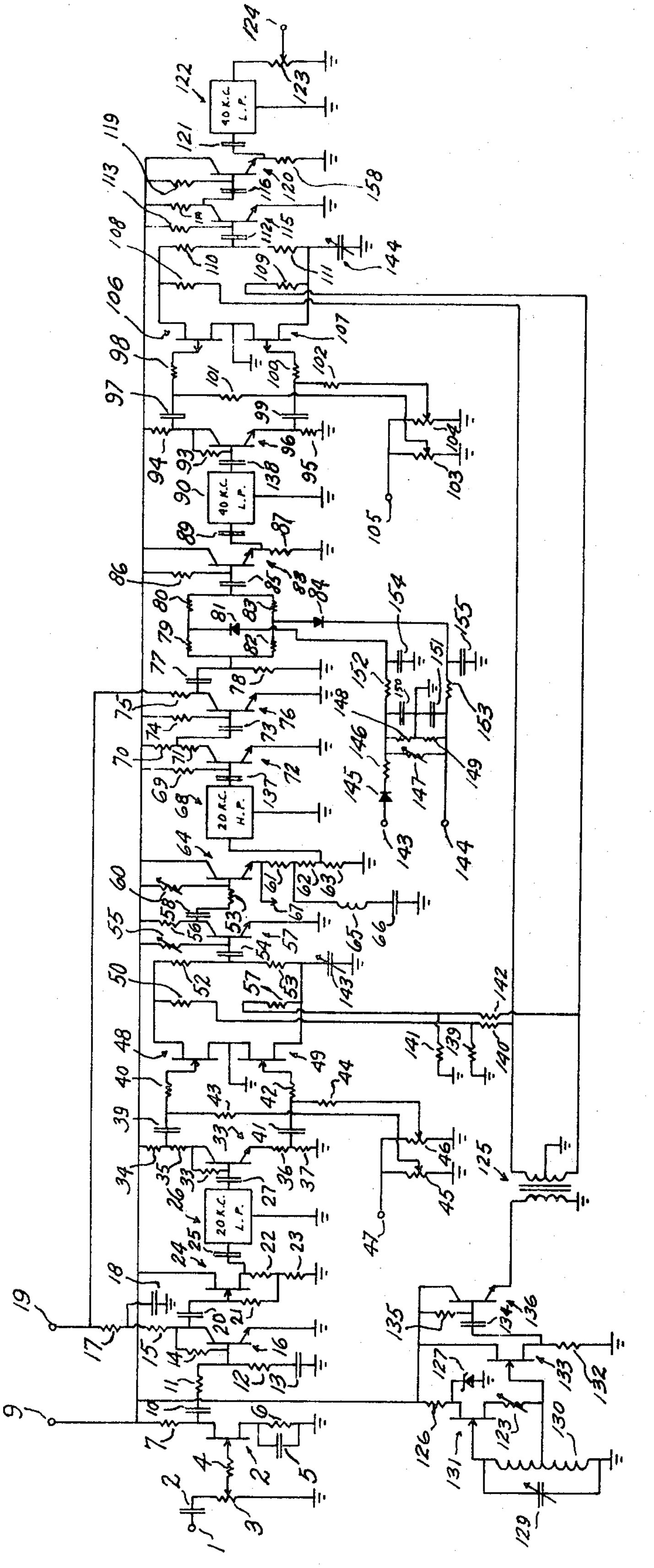
FIG. 1 shows a complete circuit embodying the present invention.

Referring to FIG. 1, an audio input is applied to terminal 1 and coupled by means of capacitor 2 to potentiometer 3, the wiper arm of which is connected to the gate of field-effect transistor 8 by means of resistor 4. Potentiometer 3 serves as an input level control and as a gate return resistor for field-effect transistor 8. Resistor 4 serves to limit the flow of gate current on positive signal alternations in the event of an overload at the wiper arm of potentiometer 3. Resistor 4 has no other effect on operation at audio frequencies. Field-effect transistor 8 serves as an amplifier to obtain satisfactory input sensitivity, with load resistor 7, bias resistor 6 and bypass capacitor 5. The drain of field-effect transistor is connected by means of capacitor 10 to a low-frequency compensation network consisting of resistor 11, resistor 12 and capacitor 13, operating in conjunction with the input impedance of transistor 16. Transistor 16 is used as an amplifier for the low-frequency compensation network, with load resistor 15 and bias resistor 14. A d.c. voltage higher than the supply voltage applied to terminal 9 is applied to the upper end of resistor 15 by means of series resistor 17 and bypass capacitor 18, in order to obtain increased gain. It is found that this method of low-frequency compensation does not result in overdriving of the first modulator when standard program material is applied to the input and the mid-frequencies do not overdrive the modulator. The collector of transistor 16 is connected to the gate of field-effect transistor 24 by means of coupling capacitor 20. Field-effect transistor 24 serves as a source follower, with load resistor 23, bias resistor 22 and gate return resistor 21. The source of field-effect transistor 24 is connected to 20 k.c. low pass filter 26 by capacitor 25. Low pass filter 26 is a conventional elliptic type which requires a low impedance driver and serves to eliminate ultrasonic frequencies which are present in some types of input material, such as phonograph records with a very high degree of surface noise, e.g., 78 r.p.m. For input material of this type, "image frequencies" of the form 40 k.c.+f are present, which produce difference products of the form 20 k.c.+f in the first modulator and therefore result in spurious noise at the output of the device. If normal input material only is used, however, low pass filter 26 and its driver may be omitted. The output of low pass filter 26 is connected to the base of transistor 38 by capacitor 27. Transistor 38 serves as a phase inverter, with load resistors 34, 35, 36 and 37, and bias resistor 33. The phase inverter outputs are taken at the junctions of resistors 34, 35 and resistors 36, 37 to allow the highest signal-to-noise ratio to be obtained from the preceding circuitry while applying the proper drive levels to the first modulator. The tapping also allows the level of internal noise from the phase inverter transmitted to the first modulator to be lowered.

The phase inverter outputs are connected to the gates of field-effect transistors 48 and 49 by means of coupling capacitors 39, 41 and resistors 40, 42. Resistors 40, 42 serve the same purpose as resistor 4. Reverse gate bias is applied to field-effect transistors 48 and 49 by resistors 43 and 44, the lower ends of which are connected to the wiper arms of potentiometers 45 and 46. A negative voltage is applied to terminal 47. The reverse polarity must be applied to terminal 47 if p-channel rather than n-channel devices are used for field-effect transistors 48 and 49. The first modulator is formed by transistors 48 and 49 in conjunction with resistors 50, 51, 52 and 53. Opposite polarity carrier voltages are applied to the lower ends of resistors 50 and 51 by voltage dividers consisting of resistors 139, 140 and 141, 142 driven by the secondary halves of transformer 125. The carrier voltages at the upper ends of resistors 139 and 141 are applied to voltage dividers consisting of field-effect transistors 48 and 49 and resistors 50 and 51. Attenuated carrier voltages appear at the drains of field-effect transistors 48 and 49, each of which is operated as a voltage-controlled variable resistor where the drain becomes negative as well as positive with respect to the source. The ohmic values of the field-effect transistors vary with the out-of-phase gate voltages produced by the phase inverter previously referred to in such a way that the attenuated carrier voltages at the drains are unequal except on zero transitions of the phase inverter input. The drain voltages are equal and out of phase when no signal is applied to the phase inverter. The drains of field-effect transistors 48 and 49 are connected to the summing network formed by resistors 52 and 53. The modulator output is taken from the junction of resistors 52 and 53. Carrier balance is obtained by a small adjustment of either potentiometer 45 or potentiometer 46. It is necessary also to adjust phase compensation capacitor 143 for exact carrier balance. The output of the summing network formed by resistors 52 and 53, whose values are high compared to those of resistors 50 and 51, is connected to the base of transistor 57 by means of coupling capacitor 54. Transistor 57 serves as an amplifier, with lead resistor 56 and bias resistor 55. The purpose of this amplifier is to raise the output of the modulator to a usable level. The modulator described above operates to produce a suppressed-carrier amplitude-modulated output with minimum envelope and carrier waveform distortion. In this way, the production of input signal distortion and carrier harmonic sidebands is avoided. This operation is a consequence of the ohmic properties of field-effect transistors 48 and 49 having low-level alternating voltages applied across their drain and source electrodes. Since no d.c. polarizing voltage is used on field-effect transistors 48 and 49, gate-to-drain signal transfer is negligible over the audio range. This results in improved suppression of direct input-to-output transfer over that due to the 20 k.c. high pass filter for the device described in this application.

Bias resistor 55 is made variable to allow minimum intermodulation to be obtained between the upper and lower sidebands produced by the first modulator. The collector of transistor 57 is connected by capacitor 58 and resistor 59 to the base of transistor 64. Transistor 64 serves as an emitter follower, with lead resistors 61, 62 and 63, bias resistor 60, and input resistor 59. Resistor 60 is made variable for the same reason as resistor 55. The emitter of transistor 64 may be monitored at point 67 to avoid overdriving or underdriving of the first modulator. A trap circuit resonant at 40 k.c., consisting of inductor 65 and capacitor 66, is connected to the junction of resistors 61 and 62 to avoid direct leading of transistor 64. This trap circuit is used to eliminate a residual level of carrier second harmonic which appears at the output of the first modulator even at exact fundamental balance. The selectivity of the trap must be sufficient that frequencies below about 37 k.c. are negligibly affected if the overall response of the noise suppressor is to be flat to 17 k.c. Alternately, a sharp-cutoff 40 k.c. low pass filter with suitable associated circuitry may be substituted for the trap circuit or a modulator may be used in which the levels of higher order harmonics are sufficiently low. A low level driving voltage is applied to 20 k.c. high pass filter 68 at the junction of resistors 62 and 63.

Figure 2:
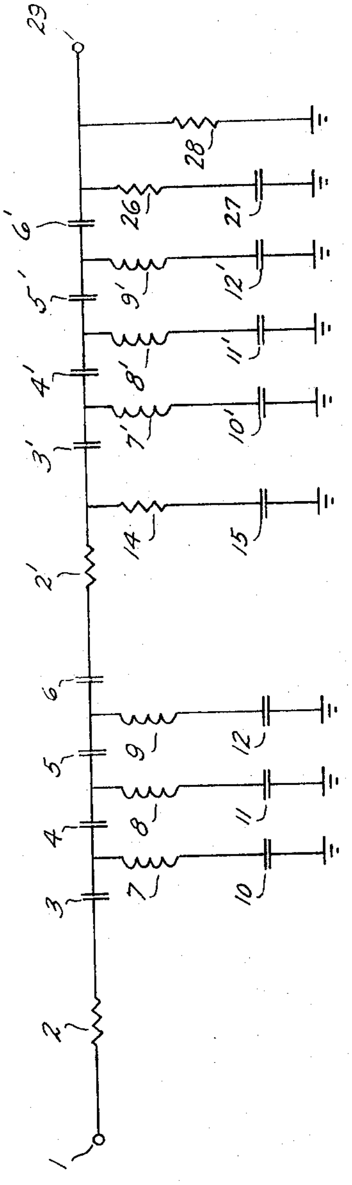
FIG. 2 shows a high pass filter to be used in the circuit of FIG. 1.

Referring to FIG. 2, a schematic is shown of a circuit suitable for use as high pass filter 68 of FIG. 1. Two identical high pass sections of the elliptic type are used with direct interconnection and compensating shunts. The primed numbers of the second section correspond to the unprimed numbers of the first section. The input signal applied to terminal 1 drives a filter section consisting of resistor 2, capacitors 3, 4, 5, 6, 10, 11 and 12, and inductors 7, 8 and 9. The filter employed is of a type that requires a low-impedance output termination, which in this case is supplied by the second section. Its configuration is such as to minimize the number of inductors required. The overall filter output is taken from terminal 29. There is an overall voltage gain of .25 in the filter passband from terminal 1 to terminal 29. Two sections are required, with practical components, to obtain the required sideband selectivity and rejection. The shunting sections consisting of resistors 14, 26 and capacitor 15, 27 serve to flatten the overall passband response. Resistor 28 is a terminating resistor. This circuit is shown only for purposes of illustration; any filter with the required transmission characteristics may, of course, be used in the circuit of FIG. 1 if impedance, level and linearity requirements are met.

Referring again to FIG. 1, the output of 20 k.c. high pass filter 68 is connected to the base of transistor 72 by capacitor 137. Transistor 72 serves as an amplifier, with load resistors 70 and 71, and bias resistor 69. This amplifier is used to increase the output of high pass filter 68 to a level adequate to drive transistor 76. The amplifier output is taken from the junction of resistors 70 and 71 to avoid direct leading of transistor 72, and to lower the level of internal noise from transistor 72. The junction of resistors 70 and 71 is connected to the base of transistor 76 by means of capacitor 73. Transistor 76, which may be a 2N3440, is an amplifier capable of a high output swing, with load resistor 75 and bias resistor 74. The upper end of load resistor 75 is connected to a relatively high d.c. voltage, which is applied to terminal 19. The voltage swing at the collector of transistor 76 is approximately 17 volts, which is a required level for driving the subsequent threshold circuit to minimize the low-level effects of the diodes employed. The collector of transistor 76 is connected to the upper end of terminating resistor 78 by coupling capacitor 77. The terminated end of capacitor 77 is connected to the input of the threshold circuit, which consists of resistors 79, 80, 82 and 83, and diodes 81 and 84 having d.c. bias voltages applied to their lower ends. A positive bias voltage is applied to the anode of diode 81 and a negative bias voltage of equal magnitude is applied to the cathode of diode 84. The bias voltages are supplied by the network consisting of rectifier diode 145, resistors 146, 147, 148, 149, 152 and 153, and filter capacitors 150, 151, 154 and 155. The ends of a floating power transformer winding are applied to terminals 143 and 144. The magnitude of the complementary bias voltages is controlled by variable resistor 147. In operation, only that part of the positive alternation of the waveform applied to the junction of resistors 79 and 82 whose instantaneous value is greater than the positive bias voltage applied to the lower end of diode 81 will appear at the junction of resistors 79 and 80, while no part of the positive alternation will appear at the junction of resistors 82 and 83. Similarly, only that part of the negative alternation of the waveform applied to the junction of resistors 79 and 82 whose instantaneous value is less than the negative bias voltage applied to the lower end of diode 84 will appear at the junction of resistors 82 and 83, while no part of the negative alternation will appear at the junction of resistors 79 and 80. Therefore only that part of the waveform applied to the threshold circuit whose instantaneous magnitude exceeds a predetermined value will be transferred to the output of the summing network formed by resistors 80 and 83, while the remainder of the waveform will be rejected.

The junction of resistors 80 and 83 is connected by coupling capacitor 85 to the base of transistor 88, which serves as an emitter follower to drive 40 k.c. low pass filter 90, with load resistor 87 and bias resistor 86. The emitter of transistor 88 is connected by coupling capacitor 89 to the input of 40 k.c. lower pass filter 90, which is a conventional elliptic type. The output of 40 k.c. low pass filter 90 is connected to the base of transistor 96 by coupling capacitor 138. Transistor 96 serves as a phase inverter, with load resistors 94 and 95, and bias resistor 93.

The phase inverter outputs are connected to the gates of field-effect transistors 106 and 107 by means of coupling capacitors 97 and 99 and series resistors 98 and 100. Reverse bias is applied to the gates of field-effect transistors 106 and 107 by means of resistors 101 and 102, the lower ends of which are connected to the wiper arms of potentiometers 103 and 104. A positive d.c. voltage is applied to terminal 105. Field-effect transistors 106 and 107 form the second modulator, in conjunction with resistors 108, 109, 110 and 111. The operation of this modulator is identical to that of the first modulator. Phase compensation capacitor 144 is used to obtain exact carrier balance. Effects of small degrees of nonlinearity are less important in this modulator than in the first modulator due to the fact that a narrow range of ultrasonic frequencies is being converted to audio, rather than vice-versa. Therefore increased input levels are applied to this modulator for greater efficiency. It may be seen that if carrier input levels to both modulators are sufficiently low that levels of internally generated carrier harmonics are negligible, a higher signal input level is permissible on the second modulator than on the first. This follows from the fact that an input frequency to the second modulator of 20 k.c.+f will produce low-level harmonics 40 k.c.+2f, 60 k.c.+3f,..., etc., in the presence of small degrees of modulator nonlinearity but the lowest modulator output product due to modulation of the carrier fundamental by input signal harmonics is 20 k.c.+2f, which is inaudible; while similar nonlinearity in the first modulator is equivalent to input waveform distortion. Similarly, input intermodulation products are less serious in the second modulator than in the first.

The junction of resistors 110 and 111 is connected to the base of transistor 115 by means of coupling capacitor 112. Transistor 115 is an amplifier serving to raise the modulator output to a usable level, having load resistor 114 and bias resistor 113. The output of this amplifier is connected to the base of transistor 120 by coupling capacitor 116. Transistor 120 is an emitter follower used to drive the 40 k.c. output low pass filter, with load resistor 158 and bias resistor 119. The emitter of transistor 158 is connected to the input of 40 k.c. low pass filter 122 by means of coupling capacitor 121. The output of low pass filter 122 is connected to potentiometer 123. Potentiometer 123 serves as an output level control and also as the terminating impedance of 40 k.c. low pass filter 122, which is a conventional elliptic type. The output of the noise suppressor is taken from terminal 124.

Transformer 125 is driven by an oscillator-follower combination consisting of field-effect transistor 131, field-effect transistor 133, transistor 136, and their associated components. Field-effect transistor 131 is used as an autotransformer oscillator, with degeneration resistor 128, oscillator coil 130 and tuning capacitor 129. Resistor 128 is made variable to adjust for a high-linearity sine wave output. The drain supply voltage of field-effect transistor 131 is stabilized by the combination of resistor 126 and zener diode 127. The center tap of oscillator coil 130 is connected to the gate of field-effect transistor 133, which serves as a high input impedance follower in conjunction with load resistor 132. Field-effect transistor 133 is of a type for which correct bias is obtained without a tap arrangement. The source of field-effect transistor 133 is connected to the base of transistor 136 by means of coupling capacitor 134. Transistor 136 serves as a low output impedance follower, with bias resistor 135 and emitter directly connected to the primary winding of transformer 125. This oscillator is tuned to the lower transition frequency of 20 k.c. high pass filter 68.

The embodiment of the present invention shown in FIG. 1 is for purposes of illustration only; any circuit corresponding to the basic idea of the invention may, of course, be used.

The invention described herein has the advantage over previously mentioned threshold devices that low frequency background noise is eliminated, as well as noise in the higher part of the spectrum. In addition, only one threshold adjustment is required, rather than a number of ganged adjustments, and the combined volume occupied by all filters described is approximately that of 3 conventional a.f. inductors, due to the small size of the components required. In operation, a smooth transition occurs from the region in which the program material is heard normally to a region of quiet in which background noise suppression is obtained. Since low-level program material is also suppressed, the signal "window" which is eliminated must be approximately 40 to 34 db. below the maximum signal level, which corresponds to the background noise level of fair to high quality audio sources. This limitation is intrinsic also to the multichannel threshold devices mentioned previously. Also, of course, suppression of intermittent noise of high amplitude, such as "swish", "clicks" and "pops", cannot be obtained with this device, or with the multichannel devices previously mentioned. However, with normal audio sources, a considerable reduction of low-level background noise may be obtained with the invention described in this application.

I claim:

1. A noise suppressor, consisting of a first modulator to which a band of lower frequencies containing noise is applied and which also is connected to means for generating a carrier input, the output of said first modulator being connected to the input of a high pass filter, the output of said high pass filter being connected to a threshold device operating to pass all input levels which exceed a predetermined level, and to reject all input levels which are below said predetermined level, the output of said threshold device being connected to a first low pass filter, the output of said first low pass filter being connected to a second modulator which also receives a carrier input of the same frequency as that applied to the previously mentioned first modulator, and the output of said second modulator being connected to a second low pass filter, from which the output of said noise suppressor is taken.

2. A noise suppressor as claimed in claim 1 wherein said carrier frequency is 20 kilocycles.

3. A noise suppressor as claimed in claim 1 wherein said high pass filter has a sharp cutoff at 20 kilocycles.

4. A noise suppressor as claimed in claim 1 wherein said first low pass filter has a sharp cutoff at 40 kilocycles.

5. A noise suppressor as claimed in claim 1 wherein said second low pass filter has a cutoff at 40 kilocycles.

6. A noise suppressor as claimed in claim 1 wherein said first and second modulators are balanced modulators.

* * * * *